(12) United States Patent
Heyen et al.

(10) Patent No.: US 7,358,604 B2
(45) Date of Patent: Apr. 15, 2008

(54) MULTICHIP CIRCUIT MODULE AND METHOD FOR THE PRODUCTION THEREOF

(75) Inventors: Johann Heyen, Munich (DE); Arne F. Jacob, Braunschweig (DE)

(73) Assignee: Technische Universitat Braunschweig Carolo-Wilhelmina, Braunschweig (DE)

( * ) Notice: Subject to any disclaimer, the term of this patent is extended or adjusted under 35 U.S.C. 154(b) by 0 days.

(21) Appl. No.: 10/567,337

(22) PCT Filed: Jul. 20, 2004

(86) PCT No.: PCT/DE2004/001576

§ 371 (c)(1),
(2), (4) Date: Sep. 11, 2006

(87) PCT Pub. No.: WO2005/015632

PCT Pub. Date: Feb. 17, 2005

(65) Prior Publication Data

US 2007/0013051 A1 Jan. 18, 2007

(30) Foreign Application Priority Data

Aug. 7, 2003 (DE) ................................. 103 36 171

(51) Int. Cl.
*H01L 23/12* (2006.01)

(52) U.S. Cl. ...................... 257/700; 257/678; 257/684; 257/706

(58) Field of Classification Search ................ 257/678, 257/684–687, 690–693, 698, 700, 701, 703–707, 257/723–725, 728, 778, 787–789, 795; 438/106–110, 438/118–127

See application file for complete search history.

(56) References Cited

U.S. PATENT DOCUMENTS

| 5,064,782 | A | * | 11/1991 | Nishiguchi | .................. 228/121 |
| 5,983,974 | A | | 11/1999 | Sylverster | |
| 6,384,701 | B1 | * | 5/2002 | Yamada et al. | ............. 333/247 |
| 2003/0071350 | A1 | * | 4/2003 | Takehara et al. | ............ 257/728 |
| 2003/0128080 | A1 | * | 7/2003 | Viswanathan et al. | ...... 333/125 |

FOREIGN PATENT DOCUMENTS

| DE | 19640192 | 4/1998 |
| DE | 10011005 | 1/2001 |
| DE | 19931004 | 2/2001 |
| DE | 10059688 | 6/2001 |

(Continued)

*Primary Examiner*—Zandra V. Smith
*Assistant Examiner*—Paul E Patton
(74) *Attorney, Agent, or Firm*—Whitham Curtis Christofferson & Cook, P.C.

(57) ABSTRACT

A multichip circuit module includes a main board, at least one carrier substrate mounted on and in electrical contact with the main board, and at least one semiconductor chip arranged on the carrier substrate and in electrical contact therewith. The carrier substrate has at least one cavity on an assembly surface for receiving the semiconductor chip. The cavity includes connecting contacts which join with associated bumps on the semiconductor chip using a flip-chip technique. The assembly surface of the carrier substrate is placed on a contact surface of the main board, and a filling material is provided between the contract surface of the main board and the assembly surface of the carrier substrate.

19 Claims, 1 Drawing Sheet

FOREIGN PATENT DOCUMENTS

| | | |
|---|---|---|
| DE | 10029255 | 12/2001 |
| DE | 10041695 | 3/2002 |
| DE | 10041770 | 3/2002 |
| DE | 10043450 | 3/2002 |
| DE | 10116510 | 5/2002 |
| EP | 0900477 | 7/2001 |
| JP | 2003174141 | 6/2003 |
| WO | WO 99/14806 | 3/1999 |

\* cited by examiner

MULTICHIP CIRCUIT MODULE AND METHOD FOR THE PRODUCTION THEREOF

FIELD OF THE INVENTION

The invention relates to a multichip circuit module having a main circuit board, at least one carrier substrate which is mounted on the main circuit board and which is in electrical contact with the main circuit board, and at least one semiconductor chip on the carrier substrate which is in electrical contact with the carrier substrate, the carrier substrate having at least one cavity on a mounting surface to accommodate at least one semiconductor chip, connecting contacts for associated bumps of the semiconductor chip being provided in the cavity, the at least one semiconductor chip being mounted on the connecting contacts by using the bumps in the flip-chip technique, the mounting surface of the carrier substrate being applied to a contact surface of the main circuit board, a filling material being provided between the contact surface of the main circuit board and the mounting surface of the carrier substrate.

The invention further relates to a method for the production of such multichip circuit modules.

BACKGROUND OF THE INVENTION

Multichip circuit modules are sufficiently well known, for example from DE 100 11 005 A1 and DE 100 41 770 A1. Primarily, high-frequency circuits in the frequency range up to 100 GHz are implemented in the form of such multichip circuit modules. The multichip circuit modules in this case comprise a carrier substrate, on which individual semiconductor chips are mounted by wire-bonding or flip-chip technology. Suitable semiconductor chips car be, for example, millimeter wave monolithic integrated circuits MMIC. The carrier substrate can also have passive circuit components, for example on the surface or in lower levels of the carrier substrate. For the high-frequency use, the carrier substrate can be, for example, a multilayer ceramic, such as low-temperature co-fired ceramics LTCC.

The carrier substrates having the passive and active circuit components in turn form submodules, which are combined on a further substrate, the main circuit board. The submodules are in electrical contact with the main circuit board and thus also with one another.

In order to make contact between the carrier substrates and the main circuit board, for example the ball-grid array BGA connecting technique is known from DE 199 31 004 A1.

The multichip circuit module is subsequently encapsulated with dielectric filling materials, as disclosed in DE 101 16 510 A1, or shielded with a metal housing, as described in DE 100 59 688 A1.

In EP 0 900 477 B1, an electronic component having surface wave filters is described, in which a carrier substrate is mounted on a main circuit board in the flip-chip technique. A metallic protective layer is applied directly to the side of the carrier substrate facing away from the connecting region between carrier substrate and main circuit board, as far as the main circuit board, so that there is a tight closure with respect to the main circuit board.

The flip-chip technique for making electrical contact between semiconductor chips and a carrier substrate or between a carrier substrate and a main circuit board with the aid of bumps which are connected to connecting contacts is described, for example, in DE 100 41 695 A1, DE 100 43 450 A1 and DE 100 29 255 A1.

In order to shield the multichip circuit modules, additional operations are disadvantageously required.

In DE 196 40 192 A1, the method for the bump-free flip-chip mounting of integrated circuits on a substrate by using anisotropically conductive adhesives is described, which describes solder particles for the metallurgical connection between integrated circuit and substrate.

JP 2003174141 A1 discloses a multichip circuit module in which a semiconductor chip is connected to bumps which, on a level of a carrier substrate, are led to connecting contacts in cavities of the carrier substrate. The mounting surface of the carrier substrate is connected to the contact surface of a main circuit board by filling material lying in between, so that the semiconductor chip is encapsulated. Electrical contact between the carrier substrate and the main circuit board is made via the cavities.

SUMMARY OF THE INVENTION

It is an object of the invention to provide an improved multichip circuit module with a more compact structure which is less expensive and, at the same time, more highly integrated.

It is also an object of the invention to provide an improved method for the production of such a multichip circuit module.

According to the invention, the object is achieved with the generic multichip circuit module in that the carrier substrate has many layers with connecting lines extending transversely through a plurality of layers. The multilayer structuring of the carrier substrate is preferably used exclusively for the passive integration of the multichip circuit module, for example for wiring arrangements, filters and bias networks.

The object is further achieved with the generic method, according to the invention, by means of the following steps:
 a) letting the at least one semiconductor chip into cavities provided for the semiconductor chips on a mounting surface of the carrier substrate;
 b) mounting the at least one semiconductor chip in the flip-chip technique by making contact with bumps of the semiconductor chips resting on connecting contacts in the cavities;
 c) applying a layer of filling material to the contact surface of the main circuit board; and
 d) applying the carrier substrate having the mounting surface to the contact surface of the main circuit board.

In comparison with the conventional production methods of multichip circuit modules, the number of operations in the assembly and connecting technique is reduced by using standard technologies. The multichip circuit module may therefore be produced relatively inexpensively and, on account of the cavities, has a more highly integrated, more compact structure.

The filling material is preferably an anisotropically conductive material, such as an anisotropically conductive paste or an anisotropically conductive film. Using these, it is not just encapsulation and shielding of the multichip circuit module which is implemented. Instead, additionally all the connections between the carrier substrate and the main circuit board are made in the same operation. As a result of the anisotropic character of the filling material, the insulation of adjacent lines is ensured.

In this case, the filling material conducts in the direction of the application height, that is to say in the direction from the main circuit board to the carrier substrate. In the surface, on the other hand, the anisotropic filling material is insulating.

The filling material is not intended to fill the interspaces of the cavities completely, in order to prevent wetting of the surface of the semiconductor chip and of the bumps with filling material, so that a change in the electrical properties is avoided as far as possible.

DESCRIPTION OF THE DRAWING FIGURES

The invention will be explained in more detail below by way of example, using the appended drawings, in which.

DETAILED DESCRIPTION OF THE INVENTION

Figure 1:
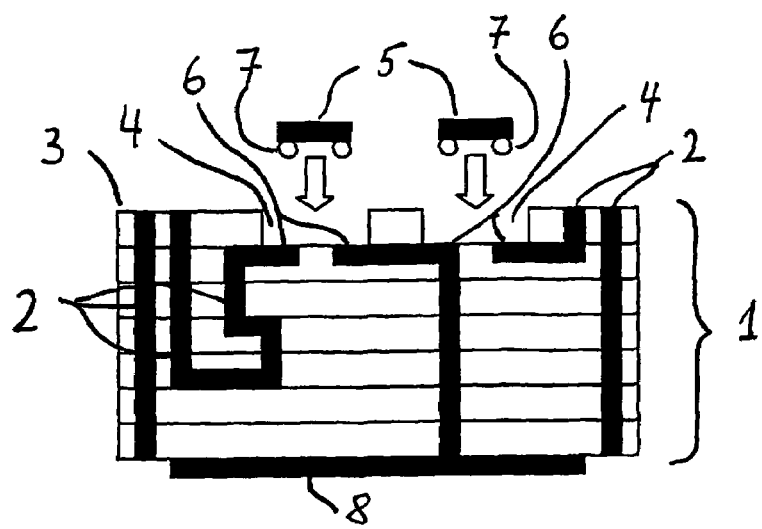
FIG. 1 shows a sketch of a carrier substrate having semiconductor chips in a cross-sectional view.

FIG. 1 reveals a sketch of a multilayer carrier substrate 1 which has a large number of conductor tracks 2. Provided on a mounting surface 3 of the carrier substrate 1 are cavities 4 in the form of rectangular recesses, into which semiconductor chips 5 can be inserted. Provided in the cavities 4 are corresponding connecting contacts 6 for bumps 7 on the underside of the semiconductor chips 5. With the aid of the bumps 7 and the connecting contacts 6, electrical contact can be made with the semiconductor chips 5 in the cavities 4 by the known flip-chip technique. As a cost-effective implementation of multilayer carrier substrates 1, in particular in conjunction with the production of cavities 4, the LTCC (low-temperature co-fired ceramics) technology is recommended.

Provided on the underside of the carrier substrate 1, which is opposite the mounting surface 3, is a planar antenna arrangement 8, for example a patch antenna. Such a design is now possible, since the carrier substrate 1 can be mounted with the mounting surface 3 on a main circuit board.

The vertical conductor tracks 2 are connecting lines for HF and DC signals which extend transversely through a plurality of layers of the carrier substrate 1. The conductor tracks 2 can, for example, comprise at least one conductor and, if appropriate, at least one additional shielding leadthrough. The vertical wiring arrangement can also be implemented in hollow-conductor technology, the vertical plated-through contacts forming the conductive walls of a hollow conductor.

Figure 2:
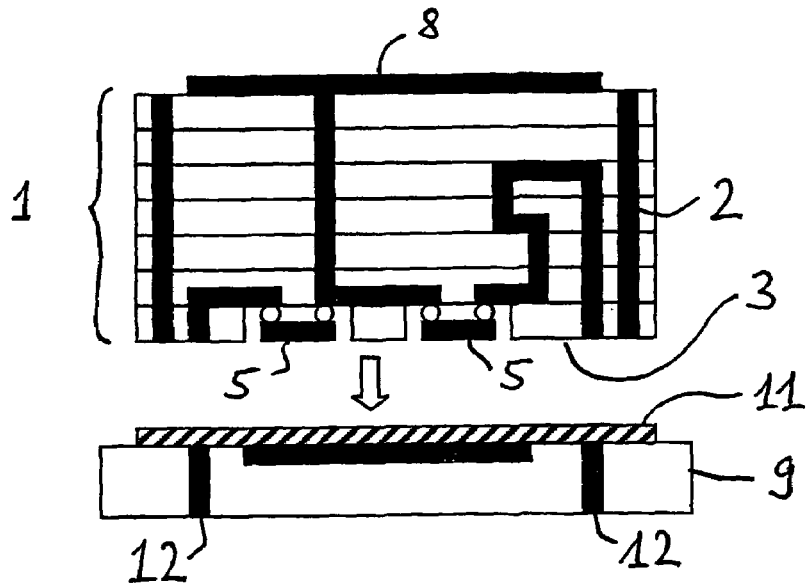
FIG. 2 shows a sketch of the carrier substrate with electrically contacted semiconductor chips rotated through 180° in order to be placed on a main circuit board, in a cross-sectional view.

FIG. 2 reveals the method step of joining the carrier substrate 1, which is rotated through 180° in relation to the carrier substrate 1 illustrated in FIG. 1, to a main circuit board 9.

Applied to the contact surface 10 of the main circuit board 9 is a filling material 11 in the form of an anisotropically conductive film, an anisotropically conductive paste or an isotropically conductive adhesive layer.

The carrier substrate 1 is then pressed with the mounting surface 3 onto the contact surface 10 having the filling material 11. In the process, the semiconductor chips 5 have already had electrical contact made with the carrier substrate 1 in the flip-chip technique. The conductor tracks 2 for making electrical contact with the semiconductor chips are led through the multilayer carrier substrate 1 to the mounting surface 3 and are electrically connected to corresponding conductor tracks 12 in the main circuit board 9 when the carrier substrate 1 is bonded to the main circuit board 9 by the filling material 11.

Figure 3:
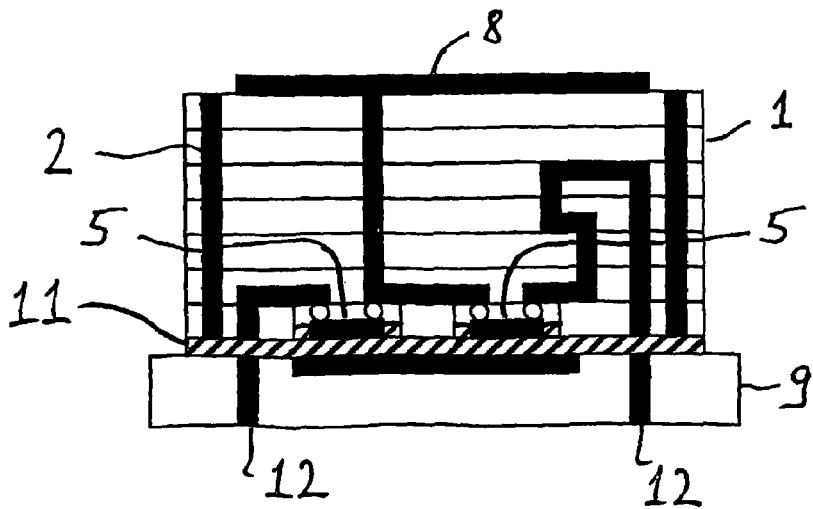
FIG. 3 shows a sketch of a multichip circuit module with carrier substrate placed on the main circuit board in a cross-sectional view.

FIG. 3 reveals a corresponding finished multichip circuit module with carrier substrate 1 and main circuit board 9 in the joined state. As a result of the use of anisotropically conductive filling material 11, which is conductive in the direction of the layer thickness of the filling material 11, that is to say in the direction from carrier substrate 1 to the main circuit board 9, and is insulating in the direction of the area of the filling material 11, an electrical connection between the conductor tracks 2 and 12 is automatically produced. In the case of isotropically conductive filling material, conductor tracks 2, 12 on the mounting surface 3 are short-circuited, so that no wiring arrangement should be provided on the mounting surface 3. Encapsulation and heat dissipation are still provided, however.

As a result of the way in which the carrier substrate 1 is fixed to the main circuit board 9 with the mounting surface 3 containing the semiconductor chips 5, which in reversed as compared with conventional multichip circuit modules, encapsulation is achieved in one operation, although this has no influence on the high-frequency property of the multichip circuit module. In addition, the heat loss produced in the semiconductor chips 5 is carried away directly to the main circuit board 9, so that additional space-consuming plated-through contacts for the dissipation of heat loss are not necessary.

By choosing the layer thickness of the filling material 11 in such a way that, when the carrier substrate 1 is set down by standard positioning devices, complete filling of the interspaces of the cavities 4 is avoided, sealing of the semiconductor chips can be achieved without the chip surface with bumps 7 and filling material 11 being wetted. Following the final curing of the filling material 11, permanent, fault-free encapsulation and shielding are ensured.

The main circuit board 9 can be a single-layer or multi-layer substrate material or a metal plate, depending on the choice of filling material 11 and the desired application.

If only fault-free encapsulation and good thermal dissipation are to be achieved, a metal plate is recommended. For more complex arrangements, the main circuit board 9 can likewise be any desired combination of multilayer substrate and, if appropriate, structured metal plate.

By producing the multichip circuit module in a suitable atmosphere, it is possible not only for air but any desired (protective) gas to be enclosed in the cavities 4.

The invention claimed is:

1. A multichip circuit module having a main circuit board, at least one carrier substrate mounted on the main circuit board and which is in electrical contact with the main circuit board, and at least one semiconductor chip on the carrier substrate which is in electrical contact with the carrier substrate, wherein the carrier substrate has at least one cavity on a mounting surface to accommodate said at least one semiconductor chip, the carrier substrate having a plurality of layers with conductor tracks extending transversely through said plurality of layers and terminating in conductor contacts on said mounting surface, connecting contacts for associated bumps of said at least one semiconductor chip are provided in said at least one cavity, the at least one semiconductor chip being mounted on the connecting contacts by using the associated bumps in a flip-chip technique, and the mounting surface of the carrier substrate being applied to a contact surface of the main circuit board via a filling material that provides i) a heat dissipation path from said at least one semiconductor chip in said at least one cavity to said circuit board and ii) electrical connection between said conductor contacts and corresponding contacts on said circuit board, without enclosing the connecting contacts and bumps.

2. The multichip circuit module as claimed in claim 1, wherein the filling material is an anisotropically conductive material.

3. The multichip circuit module as claimed in claim 1 wherein the filling material does not fill the interspaces of the at least one cavity completely.

4. The multichip circuit module as claimed in claim 1 wherein the conductor tracks of the carrier substrate are led to the mounting surface and are connected electrically and mechanically to conductor tracks of the main circuit board, and wherein said filling material provides insulation within the filling material between said conductor contacts and encapsulation of said at least one semiconductor chip, thereby providing for the simultaneous carrying of signals, dissipation of heat, encapsulation and shielding.

5. The multichip circuit module as claimed in claim 1 further comprising a planar antenna arrangement on an underside of the carrier substrate, which is opposite the mounting surface.

6. The multichip circuit module as claimed in claim 1 wherein the carrier substrate is a multilayer ceramic.

7. A method for production of multichip circuit modules having a main circuit board, at least one carrier substrate mounted on the main circuit board and which is in electrical contact with the main circuit board, and at least one semiconductor chip on the carrier substrate which is in electrical contact with the carrier substrate, wherein the carrier substrate has at least one cavity on a mounting surface to accommodate said at least one semiconductor chip, the carrier substrate having a plurality of layers with conductor tracks extending transversely through said plurality of layers and terminating in conductor contacts on said mounting surface, connecting contacts for associated bumps of said at least one semiconductor chip are provided in said at least one cavity, the at least one semiconductor chip being mounted on the connecting contacts by using the associated bumps in a flip-chip technique, and the mounting surface of the carrier substrate being applied to a contact surface of the main circuit board via a filling material that provides i) a heat dissipation path from said at least one semiconductor chip in said at least one cavity to said circuit board and ii) electrical connection between said conductor contacts and corresponding contacts on said circuit board, without enclosing the connecting contacts and bumps, having the following steps:

a) letting the at least one semiconductor chip into cavities provided for semiconductor chips on a mounting surface of the carrier substrate;

b) mounting the at least one semiconductor chip by making contact with the bumps of the at least one semiconductor chip to connecting contacts in the cavities using a flip-chip technique;

c) applying a layer of filling material to the contact surface of the main circuit board; and d) applying the carrier substrate having the mounting surface to the contact surface of the main circuit board.

8. The method as claimed in claim 7 wherein said applying a layer of filling material step is performed by application of an anisotropically conductive filling material to the contact surface.

9. The method as claimed in claim 7 wherein said applying a layer of filling material step includes application of the filling material in a layer thickness which is matched in such a way that interspaces of the cavities are not filled completely with the filling material.

10. The method as claimed in claim 7 further comprising the step of electrically connecting the conductor tracks, which extend transversely through a plurality of layers of the carrier substrate and are led to the mounting surface to conductor tracks of the main circuit board.

11. The method as claimed in claim 7 wherein the steps are performed in a gas atmosphere in order to enclose gas in the cavities.

12. The multichip circuit module of claim 2 wherein said anisotropically conductive material is selected from the group consisting of an anisotropically conductive paste and an anisotropically conductive film.

13. The multichip circuit module as claimed in claim 2 wherein the filling material does not fill the interspaces of the at least one cavity completely.

14. The multichip circuit module as claimed in claim 6 wherein said multilayer ceramic is a low-temperature co-fired ceramic (LTCC).

15. The method as claimed in claim 7 wherein said anisotropically conductive filling material is a paste or a film.

16. The method as claimed in claim 8 wherein said applying a layer of filling material step includes application of the filling material in a layer thickness which is matched in such a way that interspaces of the cavities are not filled completely with the filling material.

17. The method as claimed in claim 8 wherein the steps are performed in a gas atmosphere in order to enclose gas in the cavities.

18. The method as claimed in claim 9 wherein the steps are performed in a gas atmosphere in order to enclose gas in the cavities.

19. The method as claimed in claim 10 wherein the steps are performed in a gas atmosphere in order to enclose gas in the cavities.

* * * * *